United States Patent [19]
Fukuda et al.

[11] Patent Number: 5,287,307
[45] Date of Patent: Feb. 15, 1994

[54] SEMICONDUCTOR MEMORY DEVICE

[75] Inventors: Minoru Fukuda; Yojiro Kamei; Akihisa Nakano, all of Ikeda, Japan

[73] Assignee: Ricoh Company, Ltd., Tokyo, Japan

[21] Appl. No.: 645,575

[22] Filed: Jan. 25, 1991

[30] Foreign Application Priority Data

Feb. 27, 1990 [JP] Japan ................................. 2-46999

[51] Int. Cl.⁵ .............................................. G11L 7/02
[52] U.S. Cl. .......................... 365/189.06; 365/230.06
[58] Field of Search ...................... 365/189.06, 230.06

[56] References Cited

U.S. PATENT DOCUMENTS

| 4,074,237 | 3/1976 | Spampinato | 365/230.06 |
| 4,290,119 | 9/1981 | Masuda | 365/230.06 |
| 4,347,586 | 8/1982 | Natsui | 365/189.06 |
| 4,601,014 | 7/1986 | Kitano et al. | 365/189.06 |
| 4,916,662 | 4/1990 | Mizuta | 365/189.06 |
| 5,161,121 | 1/1992 | Cho | 365/189.06 |

FOREIGN PATENT DOCUMENTS

| 62-1192 | 1/1987 | Japan . |
| 62-223888 | 3/1988 | Japan . |
| 63-239673 | 10/1988 | Japan ................. 365/189.06 |

Primary Examiner—Eugene R. LaRoche
Assistant Examiner—Christopher R. Glembocki
Attorney, Agent, or Firm—Cooper & Dunham

[57] ABSTRACT

A semiconductor memory device has a device for reading stored information out of a memory element of a semiconductor by applying a reading voltage onto a word line; and a single word line clamping circuit for controlling the reading voltage applied onto the word line such that the reading voltage is close to a relatively high threshold voltage of the memory element when the reading voltage is applied onto the word line, the word line clamping circuit being commonly disposed on a plurality of word lines.

12 Claims, 3 Drawing Sheets

SEMICONDUCTOR MEMORY DEVICE

BACKGROUND OF THE INVENTION

1. Field of the Invention

The present invention relates to a semiconductor memory device such as an EPROM (an erasable programmable read only memory) or an EPL (an erasable programmable logic) circuit provided with a clamping circuit for clamping a voltage supplied onto a word line.

2. Description of the Related Art

The erasable programmable read only memory or the erasable programmable logic circuit have advantages that a user can independently construct a logic circuit. Therefore, the erasable programmable read only memory or the erasable programmable logic circuit is widely used.

In a general semiconductor memory device, a threshold voltage is about 1.5 to 2 volts with respect to a FAMOS transistor (a floating gate avalanche MOS transistor) into which no charge is injected. This threshold voltage is increased by about 3 to 4 volts by the charge injection so that the threshold voltage is about 6 volts after the charge injection.

A shifting amount of the threshold voltage caused by the charge injection is gradually reduced as the size of the erasable programmable read only memory is reduced. Accordingly, when a reading voltage about 6 volts is applied onto word lines in a reading operation of information, a leak electric current flows between a drain and a source of the FAMOS transistor having a high threshold voltage. Therefore, it is difficult to judge values 0 and 1 with respect to information read out of the FAMOS transistors having high and low threshold voltages.

In particular, in the case of the erasable programmable logic circuit, the potentials of gates of half the number of FAMOS transistors commonly connected onto the same bit line are equal to the potential of a power source having a certain voltage. Therefore, a sum of leak electric currents flowing from the respective FAMOS transistors having the high threshold voltage is increased so that the above problem about the judgement of values 0 and 1 is easily caused in comparison with the erasable programmable read only memory.

To avoid such a problem, it is considered to improve writing efficiency with respect to a memory element and secure the amount of an injected charge. However, it is difficult to physically provide such a structure for improving writing efficiency and securing the amount of an injected charge in accordance with the reduction of the size of a semiconductor memory.

Japanese Patent Application Laying Open (KOKAI) No. 62-1192 shows a semiconductor memory device for solving the above-mentioned problems. This device is provided with a clamping circuit for controlling a voltage applied onto a word line and this clamping circuit is disposed every word line. Therefore, this device has a problem that the size of a memory element section constituting the semiconductor memory device is excessively large.

SUMMARY OF THE INVENTION

It is therefore an object of the present invention to provide a semiconductor memory device in which no memory element having a high threshold voltage is operated in error when a reading voltage is close to this threshold voltage, and a word line clamping circuit is disposed to reduce the size of a memory circuit portion in a general erasable programmable read only memory and a general erasable programmable logic circuit without changing this memory circuit portion.

The above object of the present invention can be achieved by a semiconductor memory device comprising means for reading stored information out of a memory element of a semiconductor by applying a reading voltage onto a word line; and a single word line clamping circuit for controlling the reading voltage applied onto the word line such that the reading voltage is close to a relatively high threshold voltage of the memory element when the reading voltage is applied onto the word line, the word line clamping circuit being commonly disposed on a plurality of word lines.

In the above structure, when the memory information stored in the memory element having a high threshold voltage is read, the word line clamping circuit interrupts the application of the reading voltage onto the word line so as not to apply the reading voltage greater than the above threshold voltage onto the memory element when a voltage greater than the threshold voltage is applied onto the memory element. Further, the work line clamping circuit is disposed in a power source section separated from a constructional portion of the memory element and supplying the reading voltage onto the plurality of word lines. Accordingly, it is not necessary to change the constructional portion of the memory element.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a semiconductor memory device in the present invention will next be described in detail with reference to the accompanying drawings.

Figure 1:
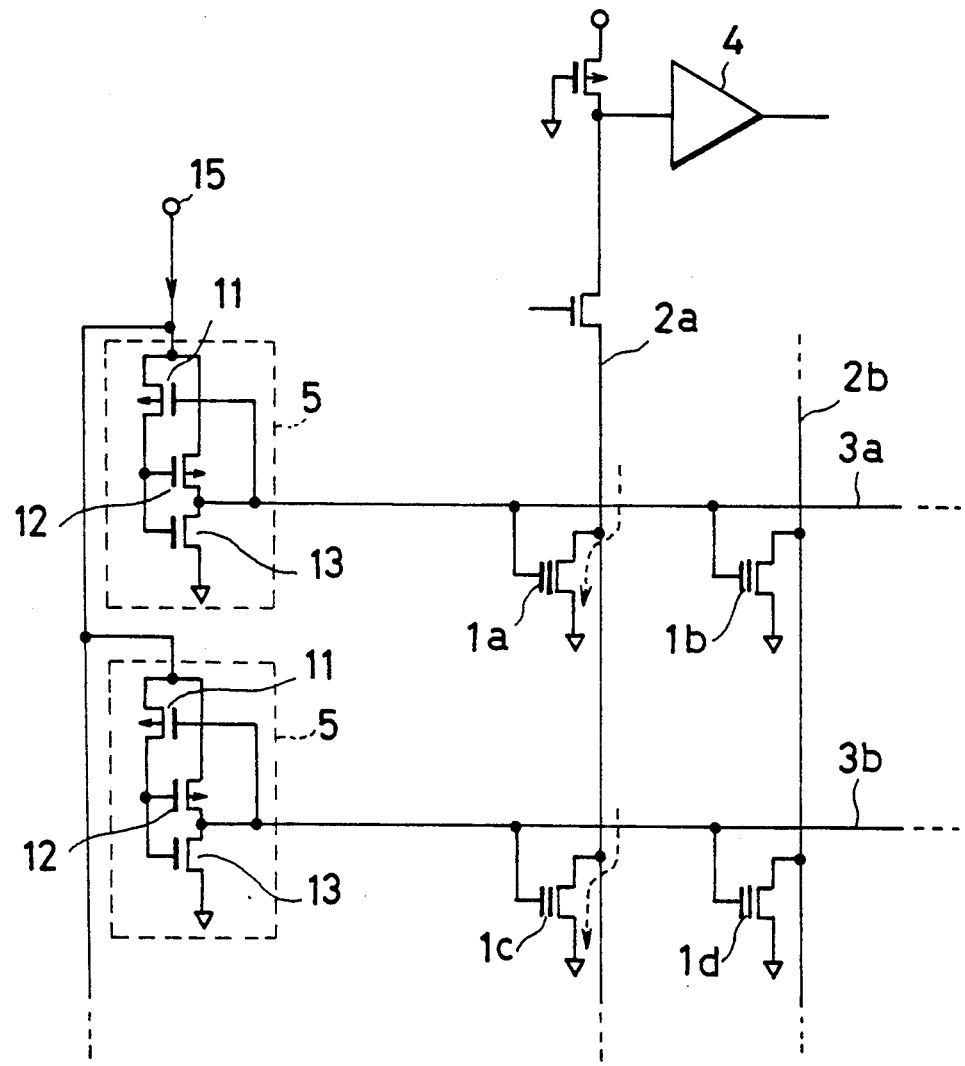
FIG. 1 is a circuit diagram showing the construction of a general erasable programmable read only memory.

In FIG. 1, FAMOS transistors (floating gate avalanche MOS transistors) 1a, 1b, 1c, 1d, - - - as a semiconductor memory element for storing information are arranged in the shape of a matrix in a general erasable programmable read only memory. The FAMOS transistors 1a, 1b, 1c, 1d, - - - are called FAMOS transistors 1 in the following description. Drains of the FAMOS transistors 1a, 1c, - - - are connected onto a common bit line 2a. Drains of the FAMOS transistors 1b, 1d, - - - are connected onto a common bit line 2b. Gates of the FAMOS transistors 1a, 1b, - - - are connected onto a common word line 3a. Gates of the FAMOS transistors 1c, 1d, - - - are connected onto a common word line 3b. Sources of the respective FAMOS transistors 1 are connected to the ground.

Sense amplifiers 4 for amplifying information read out of the respective FAMOS transistors 1 are connected onto the respective bit lines 2. Word line driving circuits 5 for operating word lines are connected onto the respective word lines 3. These word line driving circuits 5 are connected to a power source 15 having a voltage $V_{cc}$. In the above circuit structure, only constructional portions required to explain the semiconductor memory device are selected and illustrated in FIG. 1. Therefore, the other constructional portions required to construct the erasable programmable read only memory are naturally provided. Such a construction is similarly provided in a semiconductor memory device in accordance with each of first and second embodiments of the present invention described later with reference to FIG. 1.

Each of the word line driving circuits 5 is constructed by transistors 11, 12 of a P-channel and a transistor 13 of an N-channel. The power source 15 is connected to sources of the transistors 11 and 12. A drain of the transistor 11 is connected to gates of transistors 12 and 13. A drain of the transistor 12 is connected to each of the word lines 3 and a drain of the transistor 13. A source of the transistor 13 is connected to the ground. A gate of the transistor 11 is connected to each of the word lines 3.

In such FAMOS transistors 1, a threshold voltage is about 1.5 to 2 volts with respect to the FAMOS transistors 1 into which no charge is injected. This threshold voltage is increased by about 3 to 4 volts by the charge injection so that the threshold voltage is about 6 volts after the charge injection.

A shifting amount of the threshold voltage caused by the charge injection is gradually reduced as the size of an erasable programmable read only memory is reduced. Accordingly, when a reading voltage about 6 volts is applied onto the word lines 3 in a reading operation of information, a leak electric current flows between the drain and the source of each of the FAMOS transistors 1 having a high threshold voltage. Therefore, it is difficult to judge values 0 and 1 with respect to information read out of the FAMOS transistors 1 having high and low threshold voltages.

In particular, in the case of the erasable programmable logic circuit, the potentials of gates of half the number of FAMOS transistors 1 commonly connected onto the same bit line are equal to the potential of a power source having voltage $V_{cc}$. Therefore, a sum of leak electric currents flowing from the respective FAMOS transistors 1 having the high threshold voltage is increased so that the above problem about the judgment of values 0 and 1 is easily caused in comparison with the erasable programmable read only memory.

To avoid such a problem, it is considered to improve writing efficiency with respect to a memory element and secure the amount of an injected charge. However, it is difficult to physically provide such a structure for improving writing efficiency and securing the amount of an injected charge in accordance with the reduction of the size of a semiconductor memory.

Japanese Patent Application Laying Open (KOKAI) No. 62-1192 shows a semiconductor memory device for solving the above-mentioned problems. This device is provided with a clamping circuit for controlling a voltage applied onto a word line and this clamping circuit is disposed every word line. Therefore, this device has a problem that the size of a memory element section constituting the semiconductor memory device is excessively large.

Figure 2:
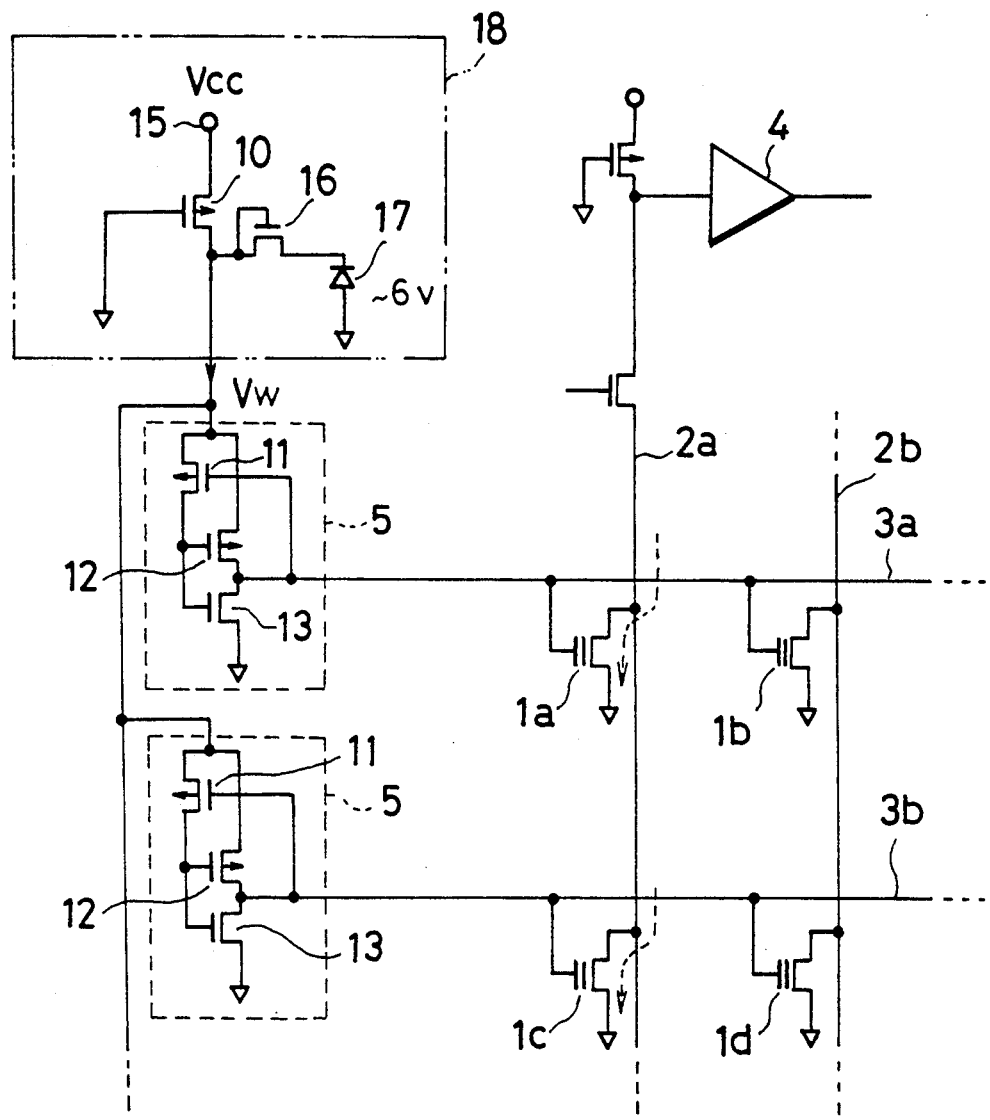
FIG. 2 is a circuit diagram showing a semiconductor memory device in a first embodiment of the present invention.

FIG. 2 shows a semiconductor memory device in a first embodiment of the present invention. In FIG. 2, the same constructional portions as those in FIG. 1 are designated by the same reference numerals and their explanations are therefore omitted in the following description.

In FIG. 2, a MOS transistor 10 of a P-channel has a gate connected to the ground and a source connected to a power source 15. A drain of the MOS transistor 10 is connected to sources of MOS transistors 11 and 12 as shown in the structure shown in FIG. 1. The drain of the MOS transistor 10 is also connected to a drain and a gate of a MOS transistor 16 of an N-channel. A source of this MOS transistor 16 is connected to a cathode of a constant voltage diode 17 having an anode connected to the ground. The MOS transistor 16 is turned on when a gate voltage of this transistor is about 6 volts. The transistors 10, 16 and the diode 17 mentioned above constitute a clamping circuit 18.

The operation of an erasable programmable read only memory having such a clamping circuit 18 will next be described.

Figure 3:
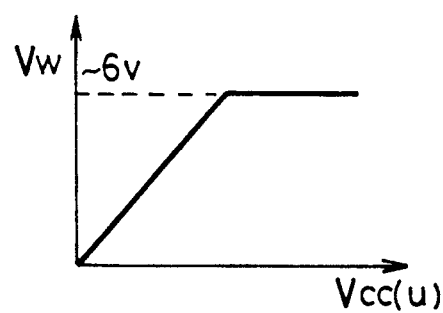
FIG. 3 is a graph for explaining the operation of a clamping circuit shown in FIG. 2.

FAMOS transistors (floating gate avalanche MOS transistors) 1a, 1b, 1c, 1d, - - - constitute the erasable programmable read only memory and store information with respect to value 1 or 0 as mentioned above. Threshold voltages of the FAMOS transistors 1 are set to be high or low in accordance with written information. A voltage $V_{cc}$ of the power source 15 is increased to read stored information out of the FAMOS transistors 1. When the power voltage $V_{cc}$ reaches about 6 volts, the transistor 16 is turned on and an electric current flows through the transistors 10, 16 and the constant voltage diode 17 from the power source 15. As shown in FIG. 3, no power voltage $V_{cc}$ is increased to a value greater than the approximately 6 volts by a constant voltage action of the constant voltage diode 17. Accordingly, there is no case in which the FAMOS transistors 1 having high threshold voltages are turned on by increasing the power voltage $V_{cc}$ to the value greater than the approximately 6 volts. Therefore, no leak electric current flows out of the FAMOS transistors 1 and there is no case in which it is difficult to judge stored information as mentioned above in the case of the general semiconductor memory device.

Figure 4:
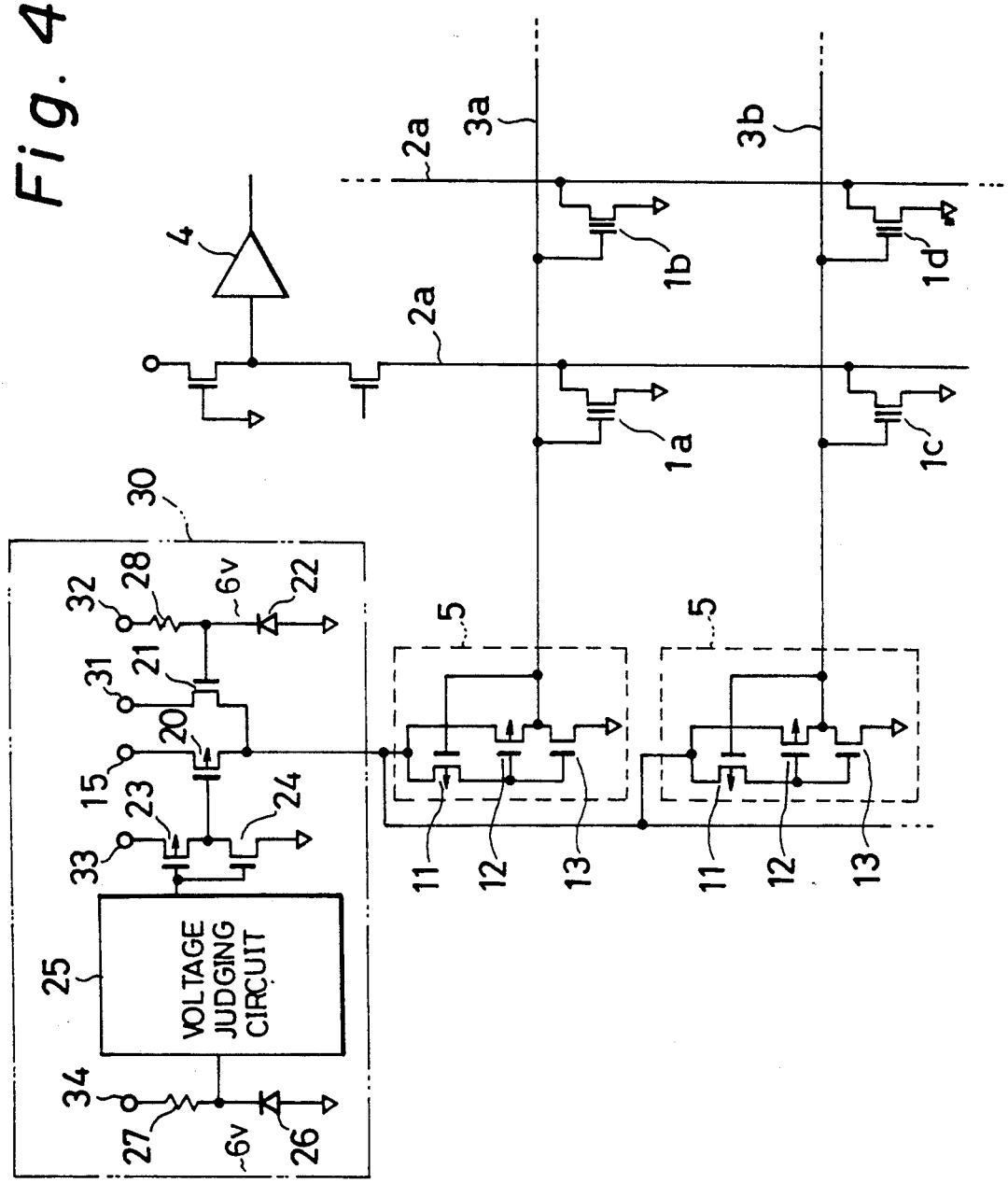
FIG. 4 is a circuit diagram showing a semiconductor memory device in a second embodiment of the present invention.

FIG. 4 shows a semiconductor memory device in a second embodiment of the present invention. In FIG. 4, the same constructional portions as those in FIG. 2 are designated by the same reference numerals and their explanations are therefore omitted in the following description.

In FIG. 4, a power source 15 is connected to a source of a MOS transistor 20 of a P-channel for interrupting the application of a voltage to a word line driving circuit 5. A drain of the MOS transistor 20 is connected to sources of MOS transistors 11, 12 and a source of a MOS transistor 21. A gate of the MOS transistor 20 is connected to a drain of a MOS transistor 23 of a P-channel and a drain of a MOS transistor 24 of an N-channel constituting an inverter. A source of the MOS transistor 23 is connected to a power source 33 having the same potential as the power source 15. A source of the MOS transistor 24 is connected to the ground. Gates of these transistors 23 and 24 are connected to an output terminal of a voltage judging circuit 25. An input terminal of the voltage judging circuit 25 is connected to a cathode of a constant voltage diode 26. The cathode of the constant voltage diode 26 is connected to a power source 34 having the same potential as the power source 15 through a resistor 27. An anode of the constant voltage diode 26 is connected to the ground. The voltage judging circuit 25 is a circuit for detecting that a power voltage $V_{cc}$ is greater than about 6 volts and changing the voltage level of a signal transmitted from the output terminal of the voltage judging circuit 25 from a high voltage level to a low voltage level.

A drain of the MOS transistor 21 is connected to a power source 31. A gate of the MOS transistor 21 is connected to the cathode side of a constant voltage diode 22 having an anode connected to the ground and a cathode connected to a power source 32 having the same potential as the power source 15 through a resistor 28.

The power source 15, the transistors 20, 21, the constant voltage diode 22, the transistors 23, 24, the voltage judging circuit 25, the constant voltage diode 26, the resistors 27, 28 and the power sources 31 to 34 constitute a clamping circuit 30.

The operation of an erasable programmable read only memory having such a clamping circuit 30 will next be described.

Similar to the first embodiment mentioned above, it is assumed that some threshold voltages of FAMOS transistors 1a, 1b, 1c, 1d, - - -are set to be high. In such a state, a voltage $V_{cc}$ of the power sources 15 and 31 to 34 is increased to read stored information out of the FAMOS transistors 1. When the power voltage $V_{cc}$ is less than about 6 volts, the voltage judging circuit 25 transmits a signal having a high voltage level to the gates of the transistors 23 and 24. Thus, the transistor 23 is turned off and the transistor 24 is turned on so that the voltage level of a signal transmitted to the gate of the transistor 20 is a low level. Accordingly, the transistor 20 is turned on so that the power voltage $V_{cc}$ is applied from the power source 15 onto word lines 3 through the word line driving circuit 5.

When the power voltage $V_{cc}$ is increased and exceeds about 6 volts, the voltage judging circuit 25 detects this state. Then, the voltage judging circuit 25 changes the voltage level of the above signal to a low voltage level from the high voltage level provided when the power voltage $V_{cc}$ is less than about 6 volts, and transmits a signal having this low voltage level. Thus, the transistor 23 is turned on and the transistor 24 is turned off. A signal having the high voltage level is transmitted to the gate of the transistor 20 through the transistor 23 so that the transistor 20 is turned off. Accordingly, no voltage of the power source 15 is applied to the word line driving circuit 5. Therefore, when the power voltage $V_{cc}$ exceeds about 6 volts, no voltage greater than about 6 volts is applied onto the word lines 3. At this time, a predetermined voltage is applied onto signal lines subsequent to the transistor 20 from the power source 31 connected to the transistor 21 so as to prevent these signal lines from attaining a floating state. Accordingly, similar to the above-mentioned first embodiment, there is no case in which the FAMOS transistors 1 having high threshold voltages are turned on by increasing the power voltage $V_{cc}$ to a value greater than about 6 volts. Therefore, there is no case in which it is difficult to judge stored information as mentioned in the case of the general semiconductor memory device.

In the first embodiment, when the power voltage $V_{cc}$ is clamped, a large electric current flows through the transistors 10, 16 and the diode 17 from the power source 15. However, in the second embodiment, as mentioned above, only a predetermined voltage is applied onto the signal lines subsequent to the transistor 20 through the transistor 21 and no electric current flows through the word line driving circuit 5, thereby reducing power consumption.

As mentioned above, in the semiconductor memory device in the present invention, a power voltage is clamped such that no voltage greater than a high threshold voltage of a memory element is applied to a gate of the memory element, thereby preventing the memory element from being operated in error. Further, a clamping circuit is disposed in a power source section for applying a voltage onto all word lines so that it is not necessary to change a constructional portion of the memory element and the size of this constructional portion can be reduced. Such effects cannot be obtained in the general semiconductor memory device.

In accordance with the present invention, when information stored in the memory element having a relatively high threshold voltage is read, the clamping circuit interrupts the application of a reading voltage onto word lines when the reading voltage applied onto the word lines is increased to a voltage greater than the above threshold voltage. Thus, there is no case in which the memory information stored in the memory element is read therefrom and cannot be distinguished from memory information read out of the memory element having a low threshold voltage by the increase in reading voltage. Further, such a clamping circuit is disposed in a power source section for supplying the reading voltage onto all the word lines and separated from the constructional portion of the memory element. Therefore, it is not necessary to change a constructional portion of the memory element in the general semiconductor memory device so that the size of the constructional portion of the memory element can be reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor memory device, in which data stored in memory elements each comprising a MOS transistor are read out by applying a reading voltage onto a plurality of word lines, each of said plurality of word lines being driven by a word line driving circuit, said device comprising a single clamping circuit, connected to a plurality of said word lines through corresponding word line driving circuits, for clamping said reading voltage so as to prevent said reading voltage from exceeding a relatively high threshold voltage of said memory elements when a source voltage is greater than said relatively high threshold voltage, said clamping circuit including a circuit having a diode connected to ground.

2. A semiconductor memory device according to claim 1, wherein said clamping circuit sets said reading voltage at said relatively high threshold voltage when said source voltage is greater than said relatively high threshold voltage.

3. A semiconductor memory device according to claim 2, wherein said clamping circuit is disposed in a power source section separated from a constructional portion of said memory elements, said power source section supplying said reading voltage onto said plurality of word lines.

4. A semiconductor memory device according to claim 1, wherein said clamping circuit interrupts the application of said reading voltage onto said plurality of word lines when said source voltage is greater than said relatively high threshold voltage.

5. A semiconductor memory device according to claim 4, wherein said clamping circuit is disposed in a power source section separated from a constructional portion of said memory elements, said power source section supplying said reading voltage onto said plurality of word lines.

6. A semiconductor memory device according to claim 1, wherein said clamping circuit is disposed in a power source section separated from a constructional portion of said memory elements, said power source section supplying said reading voltage onto said plurality of word lines.

7. A semiconductor memory device comprising memory elements for storing data, each memory element comprising a respective MOS transistor, word lines connected to respective groups of said memory elements, a word line driving circuit applying a reading voltage onto each of a plurality of said word lines, and a single clamping circuit connected to said word line driving circuit for clamping said reading voltage to prevent the reading voltage from exceeding a relatively high threshold voltage of said memory elements when a source voltage powering said word line driving circuit is greater than said relatively high threshold voltage, wherein said clamping circuit includes a circuit having a diode connected to ground.

8. A semiconductor memory device according to claim 7, wherein said clamping circuit sets said reading voltage at said relatively high threshold voltage when said source voltage is greater than said relatively high voltage.

9. A semiconductor memory device according to claim 8, wherein said clamping circuit is disposed in a power source section of the device which is separated from said memory elements.

10. A semiconductor memory device according to claim 7, wherein said clamping circuit interrupts the application of said reading voltage onto each of said plurality of word lines when said source voltage is greater than said relatively high threshold voltage.

11. A semiconductor memory device according to claim 10, wherein said clamping circuit is disposed in a power source section of the device which is separated from said memory elements.

12. A semiconductor memory device according to claim 7, wherein said clamping circuit is disposed in a power source section of the device which is separated from said memory elements.

* * * * *